(12) United States Patent
Liao et al.

(10) Patent No.: US 7,528,472 B2
(45) Date of Patent: May 5, 2009

(54) CHIP PACKAGE MECHANISM

(75) Inventors: Hsueh-Kuo Liao, Taoyuan Hsien (TW);
Hsin-Chang Tsai, Taoyuan Hsien (TW);
Tai-Kang Shing, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 447 days.

(21) Appl. No.: 11/280,359

(22) Filed: Nov. 17, 2005

(65) Prior Publication Data
US 2006/0113660 A1    Jun. 1, 2006

(30) Foreign Application Priority Data
Nov. 26, 2004    (TW) .............................. 93136450 A

(51) Int. Cl.
*H01L 23/02*    (2006.01)
*H01L 23/06*    (2006.01)
*H01L 23/22*    (2006.01)

(52) U.S. Cl. .................. 257/680; 257/684; 257/687

(58) Field of Classification Search ................. 257/680, 257/684, 687–689, 778, E23.128, E23.135, 257/E23.136, E23.137, E23.193, E23.194
See application file for complete search history.

(56) References Cited

U.S. PATENT DOCUMENTS 5,834,835 A * 11/1998 Maekawa .................... 257/680

* cited by examiner

*Primary Examiner*—Hung Vu
(74) *Attorney, Agent, or Firm*—Birch, Stewart, Kolasch & Birch, LLP

(57) ABSTRACT

A chip package mechanism. A substrate is disposed in a receiving chamber of a base. A chip is disposed on a target surface of the substrate. A plurality of supporting elements is disposed on the target surface and surrounds the chip. A gap for receiving the chip is created in the receiving chamber and between the target surface and the base by means of the supporting elements. A barricade is disposed in the gap to separate glue filled in the receiving chamber from contacting the chip. Outside water and particles cannot enter the chip package mechanism. The chip thus has a prolonged lifespan after packaged in the chip package mechanism.

27 Claims, 4 Drawing Sheets

CHIP PACKAGE MECHANISM

BACKGROUND

The invention relates to a chip package mechanism, and in particular to a chip package mechanism effectively isolating a chip from the ambient environment and providing superior airtight seal.

A chip may provide specific functions, but must be protected using packaging techniques. The chip is prevented from damage by isolated from water and particles in the ambient environment.

FIG. 1 is a schematic perspective view of a conventional chip package mechanism 1. The chip package mechanism 1 comprises a base 10, a cover 12, and a plurality of pins 14. A chip (not shown in FIG. 1) is packaged in an internal chamber of the base 10. The cover 12 is attached to the base 10 to cover the chip, thereby preventing exposure. The pins 14 are connected to several contact points (not shown in FIG. 1) of the chip. The chip package mechanism 1 can be connected to, for example, a circuit board (not shown) by means of the pins 14.

FIG. 2 is a schematic cross section of the conventional chip package mechanism 1 of FIG. 1. The base 10 further comprises a receptacle 101 in which a chip 16 is disposed. Wires 17 are connected between the chip 16 and the connecting pads 140 of the base 10. The connecting pads 140 are connected to the pins 14 disposed outside the chip package mechanism 1. Accordingly, signals can be transmitted between the chip 16 and the circuit board. The cover 12 covers the receptacle 101 and is combined with the base 10 by a bonding plate 100. Additionally, the cover 12 may be composed of metal. The bonding plate 100 may be manufactured using a parallel reflow welding method, solder bumping method, glass sealing method, or hermetic alloy connection method. The chip 16 may be an MEMS member, a LED, a CMOS, or a saw filter, which requires a space for placement.

Accordingly, when the cover 12 is combined with the base 10 by means of the bonding plate 100 manufactured by the hermetic alloy connection method, the operational temperature for combining the cover 12 with the base 10 exceeds 320° C., causing residual stress in the chip package mechanism 1. If the bonding plate 100 is broken or cracks, the airtight seal of the chip package mechanism 1 is adversely affected, thereby the chip 16 is damaged and further disable.

Hence, there is a need for an improved chip package mechanism employing glue to fix a chip and a bonding plate to form an airtight structure. The bonding plate prevents water and particles from entering into the chip package mechanism. The glue does not contact the chip, preventing damage to the chip. The chip thus has a prolonged lifespan after packaged in the chip package mechanism.

SUMMARY

Accordingly, an embodiment of the invention provides a chip package mechanism comprising a base, a substrate, a chip, a plurality of supporting elements, and a barricade. The base comprises a receiving chamber. The substrate is disposed in the receiving chamber. The chip is disposed on a target surface of the substrate. The supporting elements are disposed on the target surface and surround the chip. A gap for receiving the chip is created in the receiving chamber and between the target surface and the base by means of the supporting elements. The barricade is disposed in the gap to separate glue filled in the receiving chamber from contacting the chip.

Another embodiment of the invention provides a chip package mechanism comprising a base, a substrate, a chip, a plurality of supporting elements, and a barricade. The base comprises a receiving chamber. The substrate is disposed in the receiving chamber. The chip comprises a target end facing the receiving chamber of the base and is disposed in the receiving chamber. The supporting elements surround the target end. A gap for receiving the chip is created in the receiving chamber and between the target end and the base by means of the supporting elements. The barricade is disposed in the gap to separate glue filled in the receiving chamber from contacting the chip.

Yet another embodiment of the invention provides a chip package mechanism comprising a base, a substrate, a chip, and a plurality of supporting elements. The base comprises a receiving chamber. The substrate is disposed in the receiving chamber. The chip is disposed on a target surface of the substrate. The supporting elements are disposed on the target surface and surround the chip. A gap for receiving the chip is created in the receiving chamber and between the target surface and the base by means of the supporting elements. The distance between the supporting elements is less than 50 micrometers, preventing glue filled in the receiving chamber from contacting the chip.

Still another embodiment of the invention provides a chip package mechanism comprising a base, a substrate, a chip, and a plurality of supporting elements. The base comprises a receiving chamber. The substrate is disposed in the receiving chamber. The chip comprises a target end facing the receiving chamber of the base and is disposed in the receiving chamber. The supporting elements surround the target end. A gap for receiving the chip is created in the receiving chamber and between the target end and the base by means of the supporting elements. The distance between the supporting elements is less than 50 micrometers, preventing glue filled in the receiving chamber from contacting the chip.

In an embodiment of the chip package mechanism, the barricade extends from the substrate to the receiving chamber, or from the receiving chamber to the substrate.

In an embodiment of the chip package mechanism, the barricade surrounds the chip or target end of the chip and has an annular shape. The height of the barricade is less than or equal to that of the supporting elements.

In an embodiment of the chip package mechanism, the distance between an extending end of the barricade and the bottom of the receiving chamber is less than 50 micrometers.

In an embodiment of the chip package mechanism, the barricade comprises a plurality of blocks located in an annular, rectangular, square, circular, or polygonal arrangement. The distance between the blocks is less than 50 micrometers.

In an embodiment of the chip package mechanism, the annular shape is selected from the group consisting of rectangle, square, circle, and polygon.

In an embodiment of the chip package mechanism, the chip package mechanism further comprises a bonding plate connected to the substrate and base to fix the substrate or chip in the receiving chamber of the base. The glue is filled between the bonding plate and the barricade or between the bonding plate and the supporting elements.

In an embodiment of the chip package mechanism, the bonding plate is manufactured using a method selected from the group consisting of parallel reflow welding, solder bumping, glass sealing, and hermetic alloy connection.

In an embodiment of the chip package mechanism, the chip package mechanism further comprises a heat-dissipating plate attached to a surface opposite the target surface of the substrate or a surface of the substrate opposite the target end.

A bonding plate connects the heat-dissipating plate to the base, fixing the heat-dissipating plate to the base.

In an embodiment of the chip package mechanism, the edge of the heat-dissipating plate is disposed in a supporting groove of the base.

In an embodiment of the chip package mechanism, the heat-dissipating plate comprises metal.

In an embodiment of the chip package mechanism, the chip package mechanism further comprises a getter disposed in the receiving chamber.

In an embodiment of the chip package mechanism, the chip is selected from the group consisting of an MEMS member, a LED, a CMOS, and a saw filter.

DESCRIPTION OF THE DRAWINGS

The invention can be more fully understood by reading the subsequent detailed description and examples with references made to the accompanying drawings, wherein.

DETAILED DESCRIPTION

Figure 1:
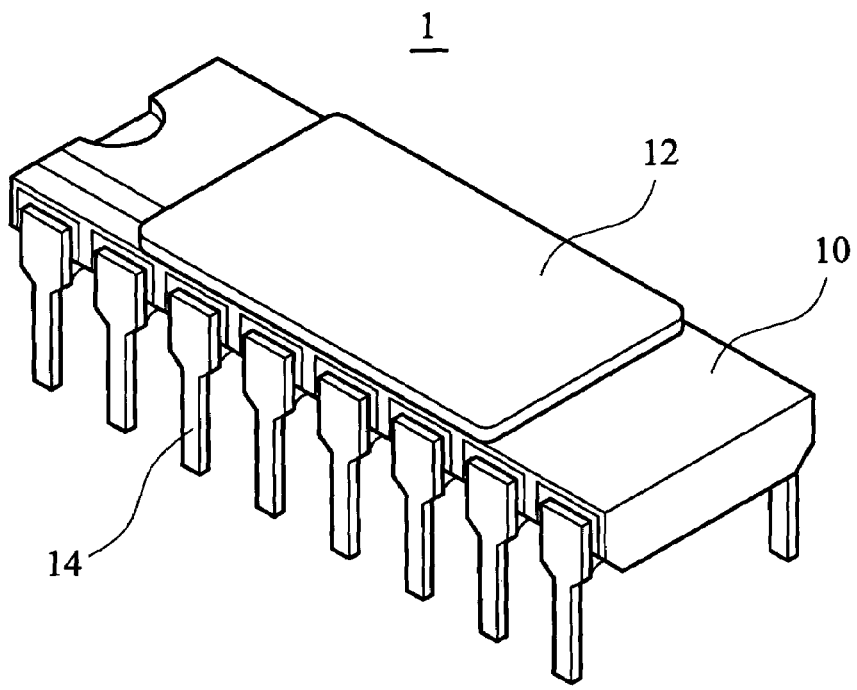
FIG. 1 is a schematic perspective view of a conventional chip package mechanism.
Figure 2:
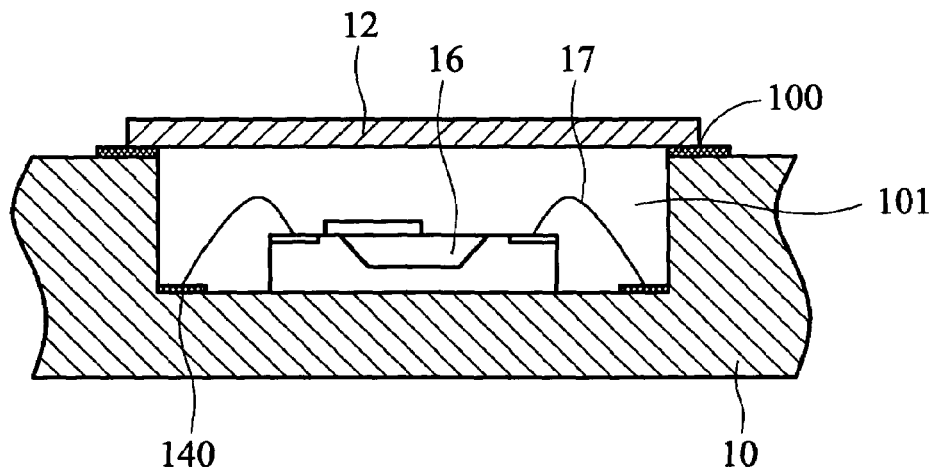
FIG. 2 is a schematic cross section of the conventional chip package mechanism of FIG. 1.
Figure 3:
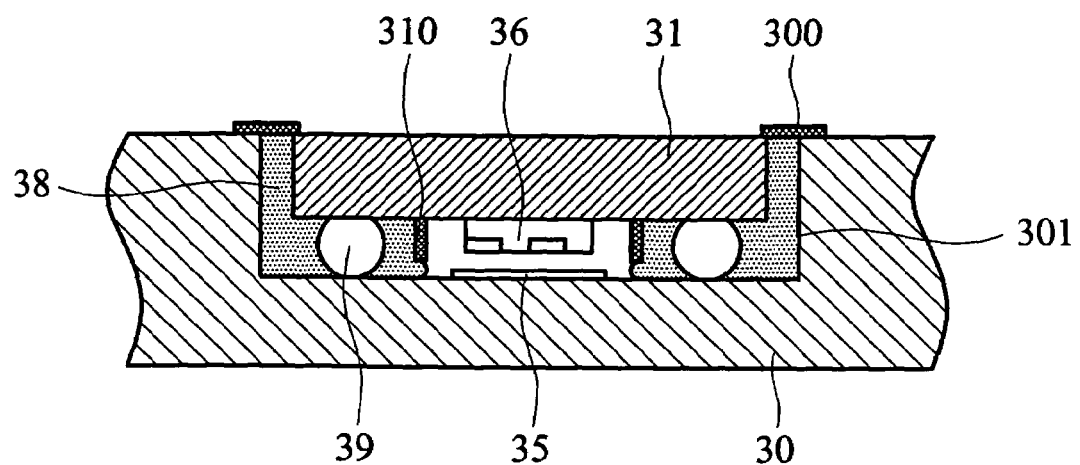
FIG. 3 is a schematic cross section of the chip package mechanism of a first embodiment of the invention.
Figure 4:
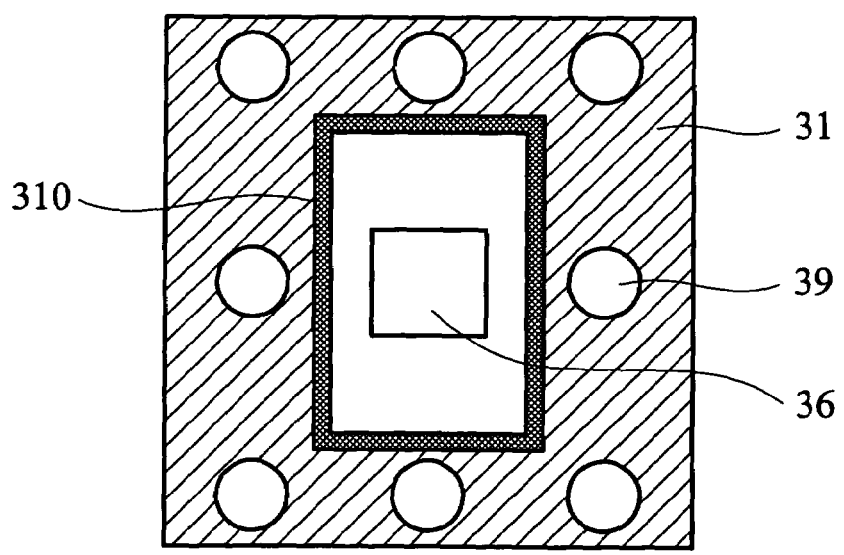
FIG. 4 is a schematic plane view of a substrate of the chip package mechanism of FIG. 3.

FIG. 3 is a schematic cross section of the chip package mechanism of a first embodiment of the invention. FIG. 4 is a schematic plane view of a substrate of the chip package mechanism of FIG. 3. The chip package mechanism of this embodiment comprises a base 30, a substrate 31, a chip 36, and at least one bonding plate 300. The base 30 comprises a receiving chamber 301 formed therein. The chip 36 is disposed on a target surface of the substrate 31. The substrate 31 is disposed in the receiving chamber 301 of the base 30 by the target surface on which the chip 36 is disposed faces. As shown in FIG. 4, a plurality of supporting elements 39 surrounds the chip 36. By means of the supporting elements 39, a gap is created in the receiving chamber 301 and between the target surface and the base 30. The chip package mechanism further comprises a barricade 310 extending from the substrate 31 to the receiving chamber 301 to prevent glue 38 filled in the receiving chamber 301 from entering the gap to contact and cause damage to the chip 36. The bonding plate 300 is connected to the bottom surface of the substrate 31 and base 30. Accordingly, the substrate 31 is fixed in the receiving chamber 301 of the base 30 and preventing water from entering the receiving chamber 301. Additionally, the bottom surface of the substrate is opposite the target surface.

Figure 5:
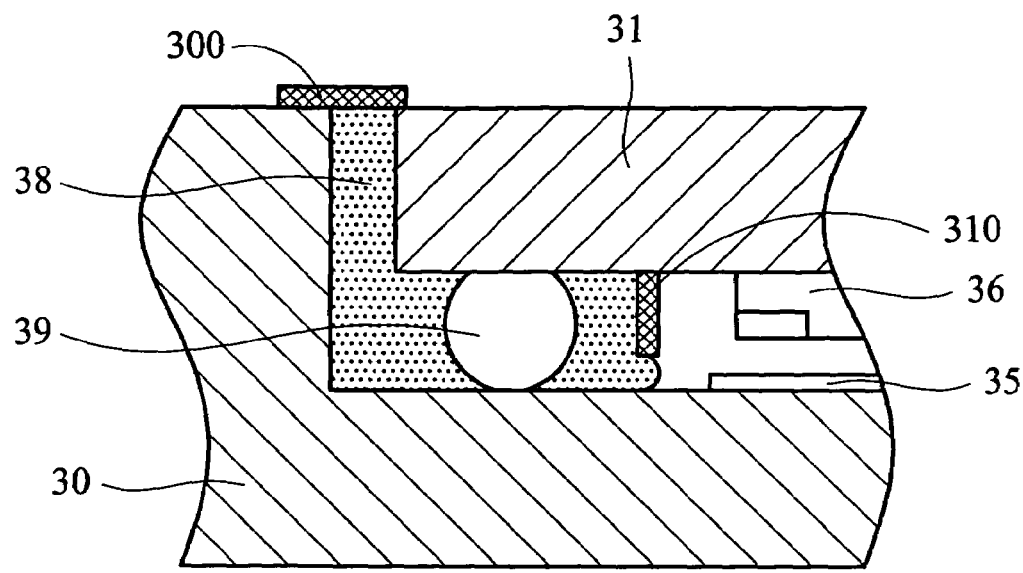
FIG. 5 is a partial enlarged view of the chip package mechanism of FIG. 3.

Accordingly, the gap is created in the receiving chamber 301 and between the target surface and the base 30 by means of the supporting elements 39. The glue 38 is filled between the bonding plate 300 and the barricade 310 to prevent outside water from entering the gap, thereby protecting the chip 36 therein. Specifically, the glue 38 filled into the receiving chamber 301 and between the bonding plate 300 and the barricade 310 is often liquid. The liquid glue 38 then undergoes a curing process to become solid. At this point, the glue 38 can protect the supporting elements 39 and prevent particles from entering the chip package mechanism. Accordingly, the barricade 310 extends from the substrate 31 (target surface) to the receiving chamber 301 or from receiving chamber 301 to the substrate 31 (target surface). As shown in FIG. 4, the barricade 310 surrounds the chip 36 and has an annular shape. The height of the barricade 310 must be less than or equal to that of the supporting elements 39. The distance between an extending end of the barricade 310 and the bottom of the receiving chamber 301 is preferably less than 50 micrometers (um). As shown in FIG. 5, when poured into the receiving chamber 301 and onto the substrate 31, the liquid glue 38 is stopped by the barricade 310 and cannot enter the gap between the target surface of the substrate 31 and the bottom of the base 30 due to viscosity of the liquid glue 38. A space thus exists for receiving the chip 36. Additionally, after solidification, the glue 38 can protect the supporting elements 39 and prevent outside particles from entering the chip package mechanism. Moreover, the glue 38 and bonding plate 300 connected to the bottom surface of the substrate 31 and base 30 can together prevent outside water from entering the chip package mechanism.

Moreover, because the liquid glue 38 contains some water, water is released during solidification of the glue 38. Accordingly, a getter 35 can be disposed in the receiving chamber 301 to absorb the water released from the glue 38 during solidification of the glue 38, protecting the chip 36 from contacting the water.

Figure 8:
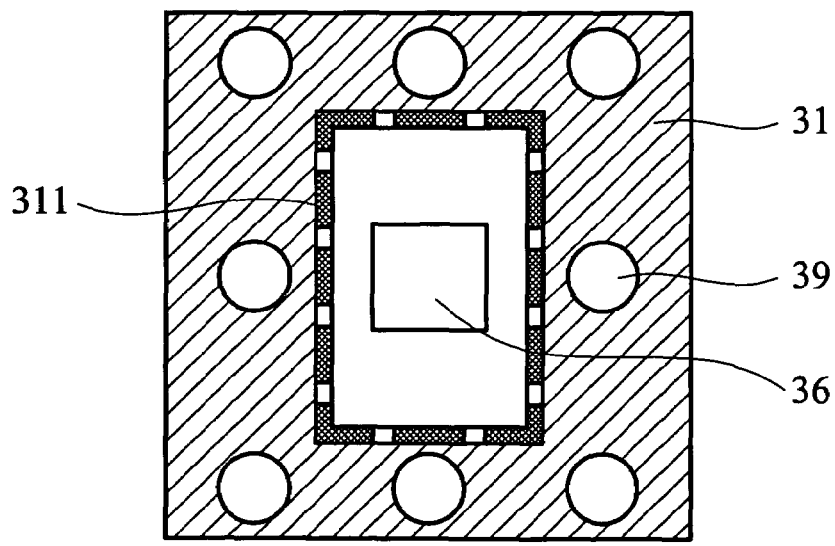
FIG. 8 is a schematic plane view of another substrate of the chip package mechanism of FIG. 3.

As shown in FIG. 4, the barricade 310 surrounds the chip 36. Alternatively, the barricade 310 can be disposed to surround the supporting elements 39 according to the position in which the glue 38 stops flowing. The annular shape of the barricade 310 can be rectangular, square, circular, or polygonal. Alternatively, as shown in FIG. 8, the barricade can comprise a plurality of blocks 311 arranged in an annular shape. The distance between the blocks 311 is also less than 50 micrometers (um). Similarly, the glue 38 is stopped by the blocks 311 and cannot enter the gap between the target surface of the substrate 31 and the bottom of the base 30.

Figure 6:
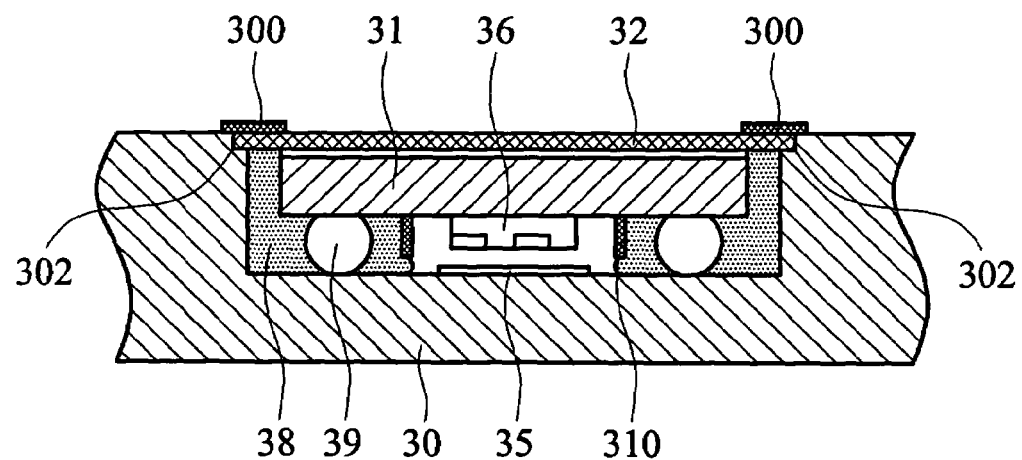
FIG. 6 is a schematic cross section of the chip package mechanism of a second embodiment of the invention.

FIG. 6 is a schematic cross section of the chip package mechanism of another embodiment of the invention. The structure of the chip package mechanism of this embodiment is similar to that of previously described embodiments. The chip package mechanism of this embodiment further comprises a heat-dissipating plate 32 attached to the bottom surface of the substrate 31. The edge of the heat-dissipating plate 32 is disposed in a supporting groove 302 of the base 30. The bonding plate 300 connects the heat-dissipating plate 32 to the base 30, fixing the heat-dissipating plate 32 to the base 30. Additionally, the bonding plate 300 comprises metal. The bonding plate 300 preferably comprises metal with a high coefficient of thermal conduction, such as copper or aluminum. Accordingly, the chip package mechanism of this embodiment is resistant to water and particles and can provide better effect of heat dissipation.

Figure 7:
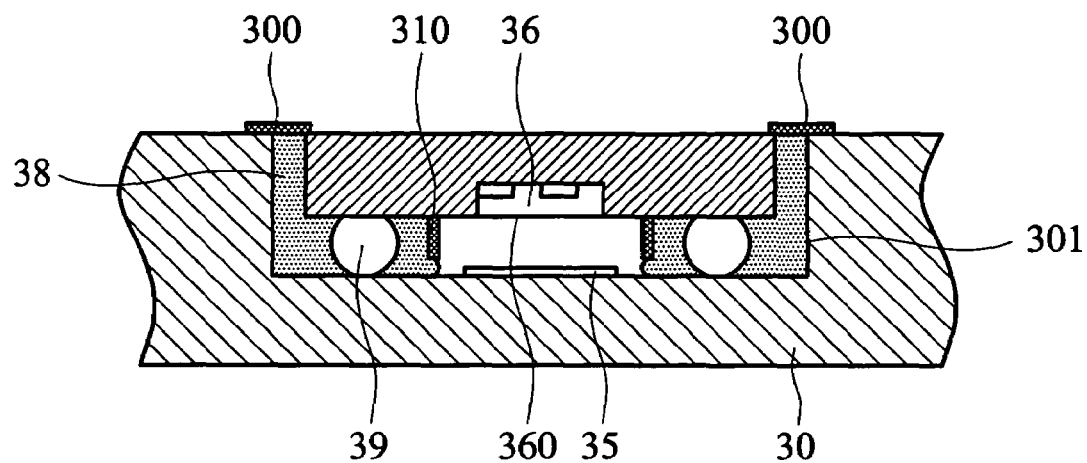
FIG. 7 is a schematic cross section of the chip package mechanism of a third embodiment of the invention.

FIG. 7 is a schematic cross section of the chip package mechanism of yet another embodiment of the invention. The structure of the chip package mechanism of this embodiment is similar to that of previously described embodiments. In this embodiment, the chip 36 is directly disposed in the receiving chamber 301, and an end surface 360 of the chip 36 faces the receiving chamber 301. Additionally, the end surface 360 is the surface requiring isolation from outside water and particles. The chip package mechanism of this embodiment is packaged in the same manner as previously described, such that outside water and particles cannot enter the chip package mechanism.

In the aforementioned chip package mechanisms, a space is required for the chip 36. The chip 36 may be a MEMS member, a LED, a CMOS, or a saw filter.

The glue is filled in the receiving chamber and between the bonding plate and the barricade, and the barricade can fix the substrate. Accordingly, as compared to the conventional chip package mechanism, the present chip package mechanisms can absorb more residual stress. The glue and bonding plate can prevent outside water and particles from entering the chip package mechanism, protecting the chip disposed therein. Thus, performance of the chip package mechanism can be enhanced.

Moreover, the supporting elements can also be used to prevent the glue filled in the receiving chamber from contacting the chip. Specifically, when the supporting elements are disposed to surround the chip, the distance between the supporting elements is less than 50 micrometers (um). Thus, the supporting elements can provide the same function as the barricade, preventing the glue filled in the receiving chamber from contacting the chip.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package mechanism, comprising:
   a base comprising a receiving chamber;
   a substrate disposed in the receiving chamber;
   a chip disposed on a target surface of the substrate;
   a plurality of supporting elements disposed around the chip, wherein a gap is created in the receiving chamber and between the target surface and the base by means of the supporting elements; and
   a glue filled in the receiving chamber.

2. The chip package mechanism as claimed in claim 1, further comprising a barricade disposed in the gap to separate the glue filled in the receiving chamber from the chip.

3. The chip package mechanism as claimed in claim 2, wherein the height of the barricade is less than or equal to that of the supporting elements.

4. The chip package mechanism as claimed in claim 2, wherein the barricade extends from the substrate to the receiving chamber, or extends from the receiving chamber to the substrate so as to surround the chip.

5. The chip package mechanism as claimed in claim 4, wherein the distance between an extending end of the barricade and the bottom of the receiving chamber is less than 50 micrometers.

6. The chip package mechanism as claimed in claim 4, wherein the distance between an extending end of the barricade and the substrate is less than 50 micrometers.

7. The chip package mechanism as claimed in claim 2, wherein the barricade has an annular, rectangular, square, circular, or polygonal shape.

8. The chip package mechanism as claimed in claim 2, wherein the barricade comprises a plurality of blocks located in an annular, rectangular, square, circular, or polygonal arrangement.

9. The chip package mechanism as claimed in claim 8, wherein the distance between the blocks is less than 50 micrometers.

10. The chip package mechanism as claimed in claim 1, wherein the distance between the supporting elements is less than 50 micrometers, separating the glue filled in the receiving chamber from the chip.

11. The chip package mechanism as claimed in claim 1, further comprising a bonding plate connected to the substrate and base to fix the substrate in the receiving chamber of the base.

12. The chip package mechanism as claimed in claim 1, further comprising a heat-dissipating plate attached to a surface opposite the target surface of the substrate, wherein a bonding plate connects the heat-dissipating plate to the base.

13. The chip package mechanism as claimed in claim 12, wherein the edge of the heat-dissipating plate is disposed in a supporting groove of the base.

14. The chip package mechanism as claimed in claim 1, further comprising a getter disposed in the receiving chamber.

15. A chip package mechanism, comprising:
    a base comprising a receiving chamber;
    a chip comprising a target end facing the receiving chamber of the base, and disposed in the receiving chamber;
    a plurality of supporting elements surrounding the target end, wherein a gap is created in the receiving chamber and between the target end and the base by means of the supporting elements;
    a glue filled in the receiving chamber; and
    a barricade disposed in the gap to separate the glue filled in the receiving chamber from the chip.

16. The chip package mechanism as claimed in claim 15, wherein the distance between the supporting elements is less than 50 micrometers, separating the glue filled in the receiving chamber from the chip.

17. The chip package mechanism as claimed in claim 16, further comprising a getter disposed in the receiving chamber.

18. The chip package mechanism as claimed in claim 15, wherein the height of the barricade is less than or equal to that of the supporting elements.

19. The chip package mechanism as claimed in claim 15, wherein the barricade extends from the target end to the receiving chamber, or extends from the receiving chamber to the target end so as to surround the chip.

20. The chip package mechanism as claimed in claim 19, wherein the distance between an extending end of the barricade and the bottom of the receiving chamber is less than 50 micrometers.

21. The chip package mechanism as claimed in claim 19, wherein the distance between an extending end of the barricade and the target end is less than 50 micrometers.

22. The chip package mechanism as claimed in claim 15, wherein the barricade has an annular, rectangular, square, circular, or polygonal shape.

23. The chip package mechanism as claimed in claim 15, wherein the barricade comprises a plurality of blocks located in an annular, rectangular, square, circular, or polygonal arrangement.

24. The chip package mechanism as claimed in claim 23, wherein the distance between the blocks is less than 50 micrometers.

25. The chip package mechanism as claimed in claim 15, further comprising a substrate disposed in the receiving chamber, and a bonding plate connected to the substrate and base to fix the substrate in the receiving chamber of the base.

26. The chip package mechanism as claimed in claim 15, further comprising a substrate disposed in the receiving chamber, and a heat-dissipating plate attached to a surface of the substrate opposite the target end, wherein a bonding plate connects the heat-dissipating plate to the base.

27. The chip package mechanism as claimed in claim 26, wherein the edge of the heat-dissipating plate is disposed in a supporting groove of the base.

* * * * *